(12) United States Patent
Saito et al.

(10) Patent No.: US 12,098,257 B2
(45) Date of Patent: Sep. 24, 2024

(54) RESIN COMPOSITION, PREPREG, FILM WITH RESIN, METAL FOIL WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Hirosuke Saito, Osaka (JP); Yiqun Wang, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 311 days.

(21) Appl. No.: 17/626,881

(22) PCT Filed: Jul. 16, 2020

(86) PCT No.: PCT/JP2020/027599
§ 371 (c)(1),
(2) Date: Jan. 13, 2022

(87) PCT Pub. No.: WO2021/010431
PCT Pub. Date: Jan. 21, 2021

(65) Prior Publication Data
US 2022/0259424 A1   Aug. 18, 2022

(30) Foreign Application Priority Data

Jul. 17, 2019   (JP) ................................. 2019-132004

(51) Int. Cl.
*C08J 5/24* (2006.01)
*B32B 5/02* (2006.01)
(Continued)

(52) U.S. Cl.
CPC ................ *C08J 5/249* (2021.05); *B32B 5/02* (2013.01); *B32B 15/092* (2013.01); *B32B 15/14* (2013.01);
(Continued)

(58) Field of Classification Search
None
See application file for complete search history.

(56) References Cited

U.S. PATENT DOCUMENTS 5,352,745 A * 10/1994 Katayose ............... C08L 71/126
525/905
2006/0041068 A1 * 2/2006 Ohno ..................... C08L 101/00
525/191
(Continued)

FOREIGN PATENT DOCUMENTS

JP    H02/208355 A  *  8/1990  ............. B32B 27/28
JP    2004-156005 A    6/2004
(Continued)

OTHER PUBLICATIONS

Katayose—JP H02-208355 A—MT—func. PPE + triallyl compound—1990 (Year: 1990).*
(Continued)

*Primary Examiner* — John Vincent Lawler
(74) *Attorney, Agent, or Firm* — GREENBLUM & BERNSTEIN, P.L.C.

(57) ABSTRACT

An aspect of the present invention is a resin composition containing a polybutadiene compound having an epoxy group in a molecule, a polyphenylene ether compound having at least one of a group represented by the following Formula (1) and a group represented by the following Formula (2) in a molecule, a styrene-based block copolymer, and a curing agent.

(Continued)

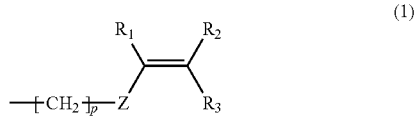

(1)

In Formula (1), p represents 0 to 10, Z represents an arylene group, and $R_1$ to $R_3$ each independently represent a hydrogen atom or an alkyl group.

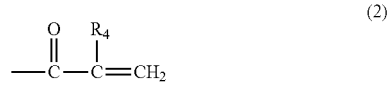

(2)

In Formula (2), $R_4$ represents a hydrogen atom or an alkyl group.

15 Claims, 5 Drawing Sheets

(51) Int. Cl.
| | | |
|---|---|---|
| B32B 15/092 | (2006.01) | |
| B32B 15/14 | (2006.01) | |
| B32B 15/20 | (2006.01) | |
| B32B 27/08 | (2006.01) | |
| B32B 27/28 | (2006.01) | |
| B32B 27/34 | (2006.01) | |
| B32B 27/36 | (2006.01) | |
| B32B 27/38 | (2006.01) | |
| C08L 63/08 | (2006.01) | |
| H05K 1/03 | (2006.01) | |
| H05K 3/02 | (2006.01) | |

(52) U.S. Cl.
CPC .............. *B32B 15/20* (2013.01); *B32B 27/08* (2013.01); *B32B 27/281* (2013.01); *B32B 27/286* (2013.01); *B32B 27/288* (2013.01); *B32B 27/34* (2013.01); *B32B 27/36* (2013.01); *B32B 27/365* (2013.01); *B32B 27/38* (2013.01); *C08J 5/24* (2013.01); *C08L 63/08* (2013.01); *H05K 1/0353* (2013.01); *H05K 1/036* (2013.01); *H05K 3/022* (2013.01); *B32B 2260/046* (2013.01); *B32B 2307/206* (2013.01); *B32B 2457/04* (2013.01); *B32B 2457/08* (2013.01); *C08J 2363/08* (2013.01); *C08J 2453/00* (2013.01); *C08J 2471/12* (2013.01); *C08L 2205/03* (2013.01)

(56) References Cited

U.S. PATENT DOCUMENTS

| | | | | |
|---|---|---|---|---|
| 2008/0254257 | A1* | 10/2008 | Inoue | C08J 5/244 |
| | | | | 524/80 |
| 2016/0168378 | A1* | 6/2016 | Umehara | H05K 1/0353 |
| | | | | 524/508 |
| 2017/0226302 | A1* | 8/2017 | Saito | B32B 15/14 |
| 2017/0260364 | A1* | 9/2017 | Hsieh | C08J 5/244 |
| 2020/0270411 | A1 | 8/2020 | Kitai et al. | |

FOREIGN PATENT DOCUMENTS

| | | | | |
|---|---|---|---|---|
| JP | 2005-105061 | | 4/2005 | |
| JP | 2005-105062 | | 4/2005 | |
| JP | 2005105061 A | * | 4/2005 | ............ B32B 15/08 |
| JP | 2005-146008 A | | 6/2005 | |
| JP | 2006-083364 | | 3/2006 | |
| JP | 2010-209142 A | | 9/2010 | |
| JP | 2017-165828 | | 9/2017 | |
| JP | 2017165828 A | * | 9/2017 | ............ B32B 15/01 |
| WO | 2019/065940 | | 4/2019 | |

OTHER PUBLICATIONS

Kawabata—JP 2005-105061 A—PCT D1—MT—resin+foil—prepreg—2005 (Year: 2005).*
Oyama—JP 2017-165828 A—PCT D3—MT—thermoset polyphenylene ether resin film—2017 (Year: 2017).*
ISR issued in International Patent Application No. PCT/JP2020/027599, Sep. 29, 2020, English translation.

* cited by examiner

RESIN COMPOSITION, PREPREG, FILM WITH RESIN, METAL FOIL WITH RESIN, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multi-layering are progressing. In addition, wiring boards to be used in various kinds of electronic equipment are required to be, for example, high-frequency compatible wiring boards such as a millimeter-wave radar board for in-vehicle use. Substrate materials for forming insulating layers of wiring boards to be used in various kinds of electronic equipment are required to have a low dielectric constant and a low dielectric loss tangent in order to increase the signal transmission speed and to decrease the signal transmission loss.

It is known that polyphenylene ether exhibits excellent low dielectric properties such as a low dielectric constant and a low dielectric loss tangent and exhibits excellent low dielectric properties such as a low dielectric constant and a low dielectric loss tangent even in a high frequency band (high frequency region) from the MHz band to the GHz band. For this reason, it has been investigated that polyphenylene ether is used, for example, as a high frequency molding material. More specifically, polyphenylene ether is preferably used as a substrate material for forming an insulating layer of a wiring board to be equipped in electronic equipment utilizing a high frequency band.

As substrate materials for forming insulating layers of wiring boards, resin compositions containing elastomers such as hydrogenated styrene butadiene styrene copolymer are used in order to improve the impact resistance of the insulating layers. Examples of such resin compositions containing elastomers include the resin composition described in Patent Literature 1.

Patent Literature 1 describes a curable resin composition containing a predetermined vinyl compound having a polyphenylene ether skeleton and a high molecular weight substance having a weight average molecular weight of 10,000 or more such as a styrene-based thermoplastic elastomer as essential components. According to Patent Literature 1, it is disclosed that it is possible to provide a cured product exhibiting no tackiness, a low dielectric constant, a low dielectric loss tangent, and excellent heat resistance when the curable resin composition is formed into a curable film.

The metal-clad laminate and the metal foil with resin used when a wiring board or the like is manufactured include not only an insulating layer but also a metal foil on the insulating layer. The wiring board also includes not only an insulating layer but also wiring on the insulating layer. Examples of the wiring include wiring derived from a metal foil included in the metal-clad laminate or the like.

As the wiring board is thinned, the refinement of wiring is required and the thickness of wiring becomes thin. Therefore, the wiring board is further required to exhibit the property that the wiring does not peel off from the insulating layer. For this reason, the wiring board is required to exhibit the property that the adhesive property between the wiring and the insulating layer is high, and the metal-clad laminate and the metal foil with resin are required to exhibit the property that the adhesive property between the metal foil and the insulating layer is high. Hence, substrate materials for forming insulating layers of wiring boards are required to provide a cured product exhibiting a high adhesive property to a metal foil.

As the thickness of wiring becomes thinner, the insulating layer included in the wiring board is required to have a lower dielectric constant in order to perform impedance matching of the wiring board and to suppress the loss due to the increase in resistance accompanying the refinement of wiring.

CITATION LIST

Patent Literature

Patent Literature 1: JP 2006-83364 A

SUMMARY OF INVENTION

The present invention has been made in view of such circumstances, and an object thereof is to provide a resin composition, which provides a cured product exhibiting low dielectric properties and a high adhesive property to a metal foil. Another object of the present invention is to provide a prepreg, a film with resin, a metal foil with resin, a metal-clad laminate, and a wiring board which are obtained using the resin composition.

An aspect of the present invention is a resin composition containing a polybutadiene compound having an epoxy group in a molecule, a polyphenylene ether compound having at least one of a group represented by the following Formula (1) and a group represented by the following Formula (2) in a molecule, a styrene-based block copolymer, and a curing agent.

[Chem. 1]

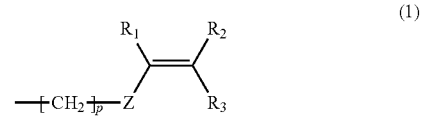

In Formula (1), p represents 0 to 10, Z represents an arylene group, and $R_1$ to $R_3$ each independently represent a hydrogen atom or an alkyl group.

[Chem. 2]

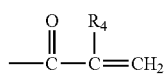

In Formula (2), $R_4$ represents a hydrogen atom or an alkyl group.

DESCRIPTION OF EMBODIMENTS

Figure 1:
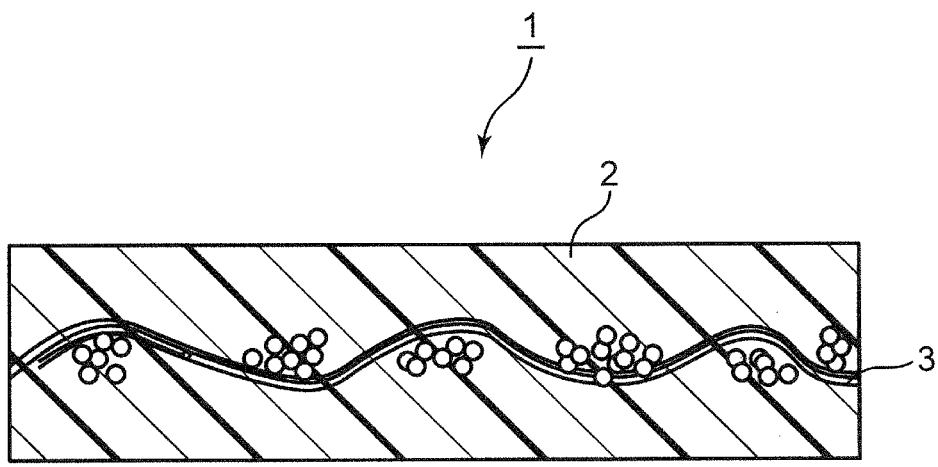
FIG. 1 is a schematic sectional view illustrating an example of a prepreg according to an embodiment of the present invention.

As a result of extensive studies, the present inventors have found out that the objects can be achieved by the following invention.

Hereinafter, embodiments according to the present invention will be described, but the present invention is not limited thereto.

[Resin Composition]

The resin composition according to the present embodiment contains a polybutadiene compound having an epoxy group in the molecule, a polyphenylene ether compound having at least one of a group represented by the following Formula (1) and a group represented by the following Formula (2) in the molecule, a styrene-based block copolymer, and a curing agent.

[Chem. 3]

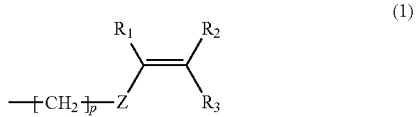

(1)

In Formula (1), p represents 0 to 10, Z represents an arylene group, and $R_1$ to $R_3$ each independently represent a hydrogen atom or an alkyl group.

[Chem. 4]

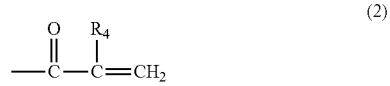

(2)

In Formula (2), $R_4$ represents a hydrogen atom or an alkyl group.

First, it is considered that a cured product which maintains the excellent low dielectric properties of polyphenylene ether is obtained from the resin composition by curing the polyphenylene ether compound together with the curing agent even though the polybutadiene compound and the styrene-based block copolymer are contained. The resin composition contains a polybutadiene compound having an epoxy group in the molecule together with the styrene-based block copolymer, and thus provides a cured product having a high adhesive property to a metal foil.

From the above, the resin composition is a resin composition which provides a cured product exhibiting low dielectric properties and a high adhesive property to a metal foil. When, for example, a metal-clad laminate is manufactured using the resin composition, a metal-clad laminate having an insulating layer exhibiting low dielectric properties and a high adhesive property to a metal foil is obtained. When a wiring board is manufactured, a wiring board including an insulating layer exhibiting low dielectric properties and a high adhesive property to wiring is obtained. When such a wiring board is obtained by subjecting the metal foil to fine circuit processing, for example, a semi additive process (SAP) or a modified semi additive process (MSAP), wiring such as wiring derived from a metal foil hardly peels off from the insulating layer. Generally, when fine circuit processing is performed, a metal foil, which has a low roughness and is thin, is used. In such a case, the wiring such as wiring derived from a metal foil tends to easily peel off from the insulating layer, but when the resin composition according to the present embodiment is used, wiring such as wiring derived from a metal foil hardly peels off from the insulating layer even in such a case.

(Polybutadiene Compound)

The polybutadiene compound is not particularly limited as long as it is a polybutadiene compound having an epoxy group in the molecule. Examples of the polybutadiene compound include epoxidized polybutadiene, namely a compound in which an epoxy group is introduced into the molecule by epoxidizing at least a part of carbon-carbon double bonds contained in polybutadiene, and a compound in which both terminals of polybutadiene are glycidyl etherified. The epoxidation is carried out, for example, by adding one oxygen atom to the carbon-carbon double bond contained in polybutadiene (polybutadiene not epoxidized) with an epoxidizing agent to form a three-membered ring epoxy group. A compound in which both terminals of polybutadiene are glycidyl etherified is obtained by adding epichlorohydrin to polybutadiene having hydroxyl groups at both terminals.

In the polybutadiene (polybutadiene not epoxidized), the steric structure of carbon-carbon double bond may be any of cis-1,4, trans-1,4, cis-1,2, and trans-1,2. The ratio of these is not particularly limited.

The epoxidizing agent is not particularly limited as long as it can epoxidize the carbon-carbon double bond contained in polybutadiene. Examples of the epoxidizing agent include percarboxylic acids such as peracetic acid, performic acid, perbenzoic acid, trifluoroperacetic acid, and perpropionic acid, organic hydroperoxides such as t-butyl hydroperoxide and cumene hydroperoxide, and hydrogen peroxide.

The concentration of oxirane oxygen in the polybutadiene compound is preferably 1% to 10% by mass, more preferably 5% to 9% by mass. When the concentration of oxirane oxygen is too low, the effect exerted by adding the polybutadiene compound and the effect of enhancing the adhesive property of the cured product of the resin composition to a metal foil tend not to be sufficiently obtained. When the concentration of oxirane oxygen is too high, the number of epoxy groups is too large and the low dielectric properties tend to be deteriorated. By using the polybutadiene compound in which the concentration of oxirane oxygen is within the above range, a resin composition is obtained, which becomes a cured product exhibiting low dielectric properties and a high adhesive property to a metal foil when being cured.

The concentration of oxirane oxygen serves as an index of the content of epoxy groups contained in the polybutadiene compound, and can be measured, for example, by a hydrogen bromide-glacial acetic acid solution method and the like.

(Polyphenylene Ether Compound)

The polyphenylene ether compound is not particularly limited as long as it is a polyphenylene ether compound having at least one of the group represented by Formula (1) and the group represented by Formula (2) in the molecule. Specific examples of the polyphenylene ether compound include a polyphenylene ether compound having at least one of the group represented by Formula (1) and the group represented by Formula (2) at the molecular terminal. More specific examples of the polyphenylene ether compound include a polyphenylene ether compound of which the terminal is modified with at least one of the group represented by Formula (1) and the group represented by Formula (2).

In Formula (1), p represents 0 to 10. In addition, Z represents an arylene group. $R_1$ to $R_3$ are independent of each other. In other words, $R_1$ to $R_3$ may be the same group as or different groups from each other. $R_1$ to $R_3$ represent a hydrogen atom or an alkyl group.

In a case where p in Formula (1) is 0, it indicates that Z is directly bonded to the terminal of polyphenylene ether.

This arylene group is not particularly limited. Examples of this arylene group include a monocyclic aromatic group such as a phenylene group, and a polycyclic aromatic group in which the aromatic is not a single ring but a polycyclic aromatic such as a naphthalene ring. In addition, this arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

In Formula (2), $R_4$ represents a hydrogen atom or an alkyl group. The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

Preferred specific examples of the group represented by Formula (1) include a vinylbenzyl group (ethenylbenzyl group) represented by the following Formula (3) and a vinylphenyl group. Examples of the vinylbenzyl group include an o-ethenylbenzyl group, a p-ethenylbenzyl group, and a m-ethenylbenzyl group. Examples of the group represented by Formula (2) include an acryloyl group and a methacryloyl group.

[Chem. 5]

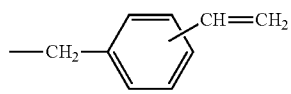

(3)

The polyphenylene ether compound has at least one of the group represented by Formula (1) and the group represented by Formula (2) in the molecule, and may have one or two or more as these groups. The polyphenylene ether compound may have, for example, any of an o-ethenylbenzyl group, a p-ethenylbenzyl group, and an m-ethenylbenzyl group, or two or three kinds thereof.

The polyphenylene ether compound has a polyphenylene ether chain in the molecule and preferably has, for example, a repeating unit represented by the following Formula (4) in the molecule.

[Chem. 6]

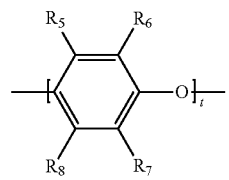

(4)

In Formula (4), t represents 1 to 50. $R_5$ to $R_8$ are independent of each other. In other words, $R_5$ to $R_8$ may be the same group as or different groups from each other. $R_5$ to $R_8$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_5$ to $R_8$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) of the polyphenylene ether compound is not particularly limited. Specifically, the weight average molecular weight is preferably 500 to 5000, more preferably 800 to 4000, and still more preferably 1000 to 3000. Note that the weight average molecular weight here may be measured by a general molecular weight measurement method, and specific examples thereof include a value measured by gel permeation chromatography (GPC). In a case where the polyphenylene ether compound has a repeating unit represented by Formula (4) in the molecule, t is preferably a numerical value so that the weight average molecular weight of the polyphenylene ether compound is in such a range. Specifically, t is preferably 1 to 50.

When the weight average molecular weight of the polyphenylene ether compound is in such a range, the polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, it is considered that since the polyphenylene ether compound according to the present embodiment has at least one of the group represented by Formula (1) and the group represented by Formula (2) in the molecule, a cured product exhibiting sufficiently high heat resistance is obtained. When the weight average molecular weight of the polyphenylene ether compound is in such a range, the polyphenylene ether compound has a relatively low molecular weight and is thus considered to exhibit excellent moldability. Hence, it is considered that such a polyphenylene ether compound not only imparts superior heat resistance to the cured product but also exhibits excellent moldability.

In the polyphenylene ether compound, the average number (number of terminal functional groups) of at least one (substituent) of the group represented by Formula (1) and the group represented by Formula (2) per one molecule of the polyphenylene ether compound is not particularly limited. Specifically, the number of terminal functional groups is preferably 1 to 5, more preferably 1 to 3, still more preferably 1.5 to 3. When this number of terminal functional groups is too small, sufficient heat resistance of the cured product tends to be hardly attained. In addition, when the number of terminal functional groups is too large, the reactivity is too high and, for example, troubles such as deterioration in the storage stability of the resin composition or deterioration in the fluidity of the resin composition may occur. In other words, when such a polyphenylene ether compound is used, for example, molding defects such as generation of voids at the time of multilayer molding occur by insufficient fluidity and the like and a problem of moldability that a highly reliable printed wiring board is hardly obtained may occur.

The number of terminal functional groups in the polyphenylene ether compound includes a numerical value expressing the average value of the substituents per one molecule of all the polyphenylene ether compounds present in 1 mole of the polyphenylene ether compound. This number of terminal functional groups can be determined by, for example, measuring the number of hydroxyl groups remaining in the obtained polyphenylene ether compound and calculating the number of hydroxyl groups decreased from the number of hydroxyl groups in the polyphenylene ether before having (before being modified with) the substituent. The number of hydroxyl groups decreased from the number of hydroxyl groups in the polyphenylene ether before being modified is the number of terminal functional groups. Moreover, with regard to the method for measuring the number of hydroxyl groups remaining in the polyphenylene ether compound, the number of hydroxyl groups can be determined by adding a quaternary ammonium salt (tetraethylammonium hydroxide) to be associated with a hydroxyl group to a solution of the polyphenylene ether compound and measuring the UV absorbance of the mixed solution.

The intrinsic viscosity of the polyphenylene ether compound is not particularly limited. Specifically, the intrinsic viscosity is preferably 0.03 to 0.12 dl/g, more preferably 0.04 to 0.11 dl/g, still more preferably 0.06 to 0.095 dl/g. When the intrinsic viscosity is too low, the molecular weight tends to be low and low dielectric properties such as a low dielectric constant and a low dielectric loss tangent tend to be hardly attained. In addition, when the intrinsic viscosity is too high, the viscosity is high, sufficient fluidity is not attained, and the moldability of the cured product tends to deteriorate. Hence, when the intrinsic viscosity of the polyphenylene ether compound is in the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound include a polyphenylene ether compound represented by the following Formula (5) and a polyphenylene ether compound represented by the following Formula (6). As the polyphenylene ether compound, these polyphenylene ether compounds may be used singly or these two kinds of polyphenylene ether compounds may be used in combination.

[Chem. 7]

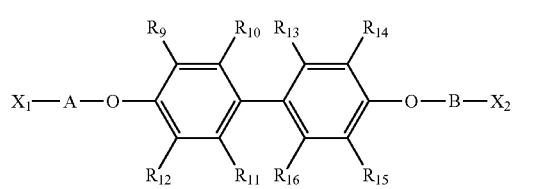

(5)

[Chem. 8]

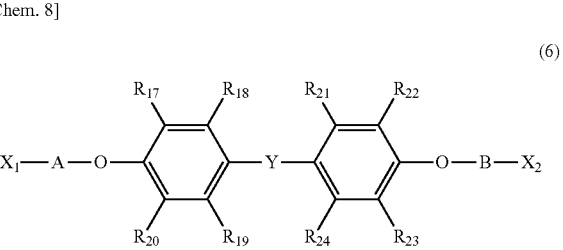

(6)

In Formulas (5) and (6), $R_9$ to $R_{16}$ and $R_{17}$ to $R_{24}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent the group represented by Formula (1) or the group represented by Formula (2). A and B represent a repeating unit represented by the following Formula (7) and a repeating unit represented by the following Formula (8), respectively. In Formula (6), Y represents a linear, branched, or cyclic hydrocarbon having 20 or less carbon atoms.

[Chem. 9]

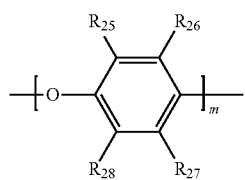

(7)

[Chem. 10]

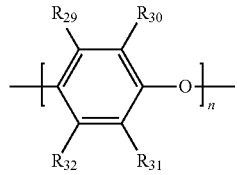

(8)

In Formulas (7) and (8), m and n each represent 0 to 20. $R_{25}$ to $R_{28}$ and $R_{29}$ to $R_{32}$ each independently represent a hydrogen atom, an alkyl group, an alkenyl group, an alkynyl group, a formyl group, an alkylcarbonyl group, an alkenylcarbonyl group, or an alkynylcarbonyl group.

The polyphenylene ether compound represented by Formula (5) and the polyphenylene ether compound represented by Formula (6) are not particularly limited as long as they are compounds satisfying the configuration. Specifically, in Formulas (5) and (6), $R_9$ to $R_{16}$ and $R_{17}$ to $R_{24}$ are independent of each other as described above. In other words, $R_9$ to $R_{16}$ and $R_{17}$ to $R_{24}$ may be the same group as or different groups from each other. $R_9$ to $R_{16}$ and $R_{17}$ to $R_{24}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (7) and (8), m and n each preferably represent 0 to 20 as described above. It is preferable that m and n represent numerical values so that the sum of m and n is 1 to 30. Hence, it is more preferable that m represents 0 to 20, n represents 0 to 20, and the sum of m and n represents 1 to 30. $R_{25}$ to $R_{28}$ and $R_{29}$ to $R_{32}$ are independent of each other. In other words, $R_{25}$ to $R_{28}$ and $R_{29}$ to $R_{32}$ may be the same group as or different groups from each other. $R_{25}$ to $R_{28}$ and $R_{29}$ to $R_{32}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_9$ to $R_{32}$ are the same as $R_5$ to $R_8$ in Formula (4).

In Formula (6), Y represents a linear, branched, or cyclic hydrocarbon having 20 or less carbon atoms as described above. Examples of Y include a group represented by the following Formula (9).

[Chem. 11]

$$-\underset{\underset{R_{34}}{|}}{\overset{\overset{R_{33}}{|}}{C}}-$$

(9)

In Formula (9), $R_{33}$ and $R_{34}$ each independently represent a hydrogen atom or an alkyl group. Examples of the alkyl group include a methyl group. Examples of the group represented by Formula (9) include a methylene group, a methylmethylene group, and a dimethylmethylene group. Among these, a dimethylmethylene group is preferable.

In Formulas (5) and (6), $X_1$ and $X_2$ are each independently the group represented by Formula (1) or the group represented by Formula (2). In the polyphenylene ether compound represented by Formula (5) and the polyphenylene ether compound represented by Formula (6), $X_1$ and $X_2$ may be the same group as or different groups from each other.

More specific examples of the polyphenylene ether compound represented by Formula (5) include a polyphenylene ether compound represented by the following Formula (10).

[Chem. 12]

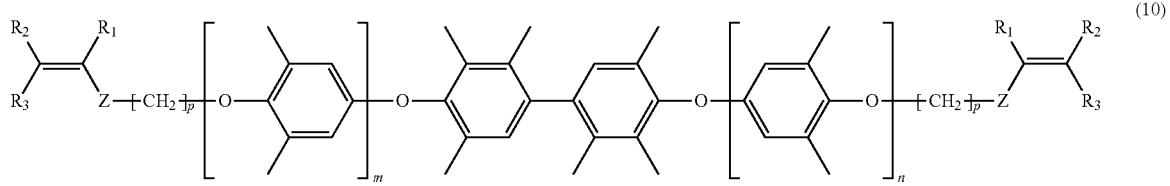

(10)

More specific examples of the polyphenylene ether compound represented by Formula (6) include a polyphenylene ether compound represented by the following Formula (11) and a polyphenylene ether compound represented by the following Formula (12).

[Chem. 13]

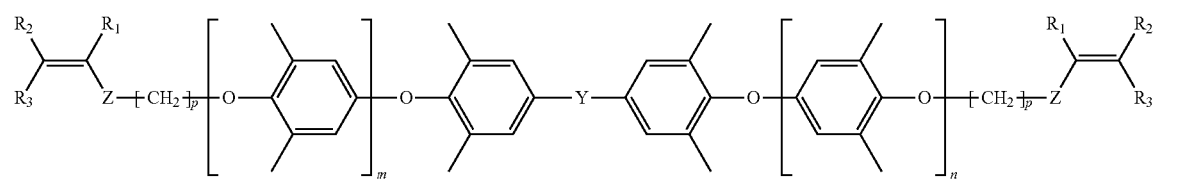

(11)

[Chem. 14]

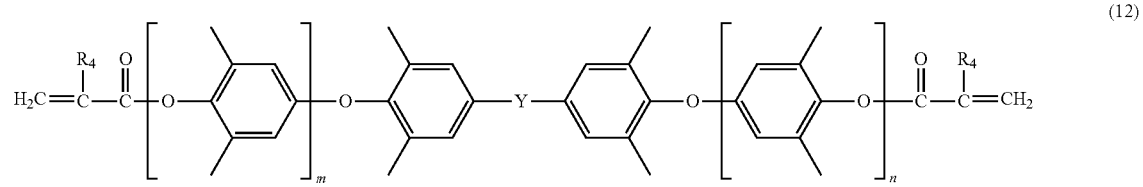

(12)

In Formulas (10) to (12), m and n are the same as m and n in Formulas (7) and (8). In Formulas (10) and (11), $R_1$ to $R_3$, p, and Z are the same as $R_1$ to $R_3$, p, and Z in Formula (1). In Formulas (11) and (12), Y is the same as Y in the above (6). In Formula (12), $R_4$ is the same as $R_1$ in Formula (2).

The method for synthesizing the polyphenylene ether compound used in the present embodiment is not particularly limited as long as a polyphenylene ether compound having at least one of the group represented by Formula (1) and the group represented by Formula (2) in the molecule can be synthesized. Here, a method for synthesizing a polyphenylene ether compound of which the terminal is modified with at least one of the group represented by Formula (1) and the group represented by Formula (2) will be described. Specific examples of this method include a method in which polyphenylene ether is reacted with a compound in which at least one of the group represented by Formula (1) and the group represented by Formula (2) is bonded to a halogen atom. Specific examples of the halogen atom include a chlorine atom, a bromine atom, an iodine atom, and a fluorine atom. Among these, a chlorine atom is preferable. More specific examples of the compound, in which at least one of the group represented by Formula (1) and the group represented by Formula (2) is bonded to a halogen atom, include o-chloromethylstyrene, p-chloromethylstyrene, and m-chloromethylstyrene. The compounds, in which at least one of the group represented by Formula (1) and the group represented by Formula (2) is bonded to a halogen atom, may be used singly or in combination of two or more kinds thereof. For example, o-chloromethylstyrene, p-chloromethylstyrene, and m-chloromethylstyrene may be used singly or in combination of two or three kinds thereof.

Polyphenylene ether which is a raw material is not particularly limited as long as a predetermined modified polyphenylene ether compound can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, such polyphenylene ether and the compound, in which at least one of the group represented by Formula (1) and the group represented by Formula (2) is bonded to a halogen atom, are dissolved in a solvent and stirred. By doing so, polyphenylene ether reacts with the compound, in which at least one of the group represented by Formula (1) and the group represented by Formula (2) is bonded to a halogen atom, and the modified polyphenylene ether compound to be used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which at least one of the group represented by Formula (1) and the group represented by Formula (2) is bonded to a halogen atom, and by doing so, at least one of the group represented by Formula (1) and the group represented by Formula (2) is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. In addition, the alkali metal hydroxide is usually used in the form of an aqueous solution and is specifically used as an aqueous sodium hydroxide solution.

The reaction conditions such as reaction time and reaction temperature also vary depending on the compound in which at least one of the group represented by Formula (1) and the group represented by Formula (2) is bonded to a halogen atom, and the like, and are not particularly limited as long as they are conditions under which the reaction as described above suitably proceeds. Specifically, the reaction temperature is preferably room temperature to 100° C., more preferably 30° C. to 100° C. The reaction time is preferably 0.5 to 20 hours, more preferably 0.5 to 10 hours.

The solvent used at the time of the reaction is not particularly limited as long as it can dissolve polyphenylene ether and the compound in which at least one of the group represented by Formula (1) and the group represented by Formula (2) is bonded to a halogen atom, and does not inhibit the reaction of polyphenylene ether with the compound, in which at least one of the group represented by Formula (1) and the group represented by Formula (2) is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition to be used in the present embodiment preferably contains a modified polyphenylene ether compound obtained as described above as the polyphenylene ether compound.

(Styrene-Based Block Copolymer)

The styrene-based block copolymer is not particularly limited as long as it is a styrene-based block copolymer, which can be used as a resin contained in a resin composition or the like used for forming an insulating layer included in a metal-clad laminate, a wiring board, and the like.

Examples of the styrene-based block copolymer include a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, and a styrene isobutylene styrene copolymer, and the styrene-based block copolymer may be any hydrogenated product of these copolymers. Among these, the styrene-based block copolymer is preferably a styrene butadiene styrene copolymer, a styrene (ethylene/butylene) styrene copolymer, a methylstyrene (ethylene/butylene) methylstyrene copolymer, and any hydrogenated product of these copolymers. The styrene-based block copolymers may be used singly or in combination of two or more kinds thereof.

By containing the styrene-based block copolymer in the resin composition, a resin composition is obtained, which becomes a cured product exhibiting a high adhesive property to a metal foil when being cured.

The weight average molecular weight of the styrene-based block copolymer is preferably 10,000 to 300,000, more preferably 50,000 to 250,000, still more preferably 60,000 to 200,000. When the molecular weight of the styrene-based block copolymer is too low, the glass transition temperature of the cured product tends to decrease or the heat resistance of the cured product tends to decrease. When the molecular weight of the styrene-based block copolymer is too high, the viscosity of the varnish of the resin composition and the melt viscosity at the time of heat molding may be too high. Hence, when the weight average molecular weight of the styrene-based block copolymer is within the above range, the glass transition temperature and heat resistance are superior and it is possible to further suppress that the adhesive property between the metal foil and the insulating layer decreases by heating and moisture absorption.

(Curing Agent)

The curing agent is a curing agent capable of reacting with the polyphenylene ether compound and curing the resin composition containing the polyphenylene ether compound. The curing agent is not particularly limited as long as it is a curing agent capable of curing a resin composition containing the polyphenylene ether compound. Examples of the curing agent include styrene, styrene derivatives, a compound having an acryloyl group in the molecule, a compound having a methacryloyl group in the molecule, a compound having a vinyl group in the molecule, a compound having an allyl group in the molecule, a compound having an acenaphthylene structure in the molecule, a compound having a maleimide group in the molecule, and an isocyanurate compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The compound having a methacryloyl group in the molecule is a methacrylate compound. Examples of the methacrylate compound include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate, and trimethacrylate compounds such as trimethylolpropane trimethacrylate.

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include triallyl isocyanurate compounds such as triallyl isocyanurate (TAIC), diallyl bisphenol compounds, and diallyl phthalate (DAP).

The compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

The compound having an isocyanurate group in the molecule is an isocyanurate compound. Examples of the isocyanurate compound include a compound having an alkenyl group in the molecule (alkenyl isocyanurate compound), and examples thereof include a trialkenyl isocyanurate compound such as triallyl isocyanurate (TAIC).

Among the above, the curing agent preferably contains, for example, an allyl compound having an allyl group in the molecule. As the allyl compound, an allyl isocyanurate compound having two or more allyl groups in the molecule is preferable, and triallyl isocyanurate (TAIC) is more preferable.

As the curing agent, the above curing agents may be used singly or in combination of two or more kinds thereof.

The weight average molecular weight of the curing agent is not particularly limited and is, for example, preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polyphenylene ether compound can be suitably cured by the reaction of the curing agent with the polyphenylene ether compound. Note that the weight average molecular weight here may be measured by a general molecular weight measurement method, and specific examples thereof include a value measured by gel permeation chromatography (GPC).

The average number (number of functional groups) of the functional groups which contribute to the reaction of the curing agent with the polyphenylene ether compound per one molecule of the curing agent varies depending on the weight average molecular weight of the curing agent, but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.
(Content)

The content of the polybutadiene compound is preferably 5 to 40 parts by mass, more preferably 5 to 25 parts by mass with respect to 100 parts by mass of the sum of the polybutadiene compound, the polyphenylene ether compound, and the curing agent. The content of the polybutadiene compound is preferably 3 to 20 parts by mass, more preferably 5 to 17.5 parts by mass with respect to 100 parts by mass of the sum of the polybutadiene compound, the polyphenylene ether compound, the styrene-based block copolymer, and the curing agent. The content of the polyphenylene ether compound is preferably 10 to 70 parts by mass, preferably 20 to 50 parts by mass with respect to 100 parts by mass of the sum of the polybutadiene compound, the polyphenylene ether compound, the styrene-based block copolymer, and the curing agent. The content of the styrene-based block copolymer is preferably 5 to 60 parts by mass, preferably 10 to 50 parts by mass with respect to 100 parts by mass of the sum of the polybutadiene compound, the polyphenylene ether compound, the styrene-based block copolymer, and the curing agent. The content of the curing agent is preferably 3 to 30 parts by mass, preferably 5 to 20 parts by mass with respect to 100 parts by mass of the sum of the polybutadiene compound, the polyphenylene ether compound, the styrene-based block copolymer, and the curing agent. When the content of each of the polybutadiene compound, the polyphenylene ether compound, the styrene-based block copolymer, and the curing agent is within the above range, a resin composition is obtained, which becomes a cured product exhibiting a higher adhesive property to a metal foil while maintaining excellent low dielectric properties when being cured.

(Other Components)

The resin composition according to the present embodiment may contain components (other components) other than the polybutadiene compound, the polyphenylene ether compound, the styrene-based block copolymer, and the curing agent, if necessary, as long as the effects of the present invention are not impaired. As other components contained in the resin composition according to the present embodiment, for example, additives such as a silane coupling agent, a flame retardant, an initiator, a curing accelerator, an antifoaming agent, an antioxidant, a polymerization inhibitor, a polymerization retarder, a dispersant, a leveling agent, a heat stabilizer, an antistatic agent, an ultraviolet absorber, a dye or pigment, a lubricant, and a filler may be further contained. The resin composition may contain thermosetting resins such as an epoxy resin, an unsaturated polyester resin, and a thermosetting polyimide resin in addition to the polyphenylene ether compound.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the respective flame retardants exemplified may be used singly or in combination of two or more kinds thereof.

As described above, the resin composition according to the present embodiment may contain a silane coupling agent. The silane coupling agent may be contained in the resin composition or may be contained as a silane coupling agent covered on the inorganic filler to be contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. Moreover, in the case of a prepreg, the silane coupling agent may be contained in the prepreg as a silane coupling agent covered on the fibrous base material for surface treatment in advance.

Examples of the silane coupling agent include a silane coupling agent having at least one functional group selected from the group consisting of a vinyl group, a styryl group, a methacryloyl group, an acryloyl group, and a phenylamino group. In other words, examples of this silane coupling agent include compounds having at least one of a vinyl group, a styryl group, a methacryloyl group, an acryloyl group, or a phenylamino group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltrimethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylmethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

As described above, the resin composition according to the present embodiment may contain an initiator (reaction initiator). The curing reaction can proceed even though the resin composition does not contain a reaction initiator. However, a reaction initiator may be added since there is a case where it is difficult to raise the temperature until curing proceeds depending on the process conditions. The reaction initiator is not particularly limited as long as it can promote the curing reaction of the polyphenylene ether compound with the curing agent. Specific examples thereof include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a metal carboxylate can be concurrently used if necessary. By doing so, the curing reaction can be further promoted. Among these, α,α'-bis(t-butylperoxy-m-isopropyl)benzene is preferably used. α,α'-bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in storage stability of the resin composition. α,α'-bis(t-butylperoxy-m-isopropyl)benzene exhibits low volatility, thus does not volatilize at the time of prepreg drying and storage, and exhibits favorable stability. In addition, the reaction initiator may be used singly or in combination of two or more kinds thereof.

As described above, the resin composition according to the present embodiment may contain a curing accelerator. The curing accelerator is not particularly limited as long as it can promote the curing reaction of the resin composition. Specific examples of the curing accelerator include imidazoles and derivatives thereof, organophosphorus-based compounds, amines such as secondary amines and tertiary amines, quaternary ammonium salts, organic boron-based compounds, and metal soaps. Examples of the imidazoles include 2-ethyl-4-methylimidazole, 2-methylimidazole, 2-phenyl-4-methylimidazole, 2-phenylimidazole, and 1-benzyl-2-methylimidazole. Examples of the organophosphorus-based compounds include triphenylphosphine, diphenylphosphine, phenylphosphine, tributylphosphine, and trimethylphosphine. Examples of the amines include dimethylbenzylamine, triethylenediamine, triethanolamine, and 1,8-diaza-bicyclo(5,4,0)undecene-7 (DBU). Examples of the quaternary ammonium salts include tetrabutylammonium bromide. Examples of the organic boron-based compounds include tetraphenylboron salts such as 2-ethyl-4-methylimidazole tetraphenylborate and tetra-substituted phosphonium tetra-substituted borates such as tetraphenylphosphonium ethyltriphenylborate. The metal soaps refer to metal salts of fatty acids, and may be metal salts of linear fatty acids or metal salts of cyclic fatty acids. Specific examples of the metal soaps include metal salts of linear fatty acids and cyclic fatty acids having 6 to 10 carbon atoms. More specific examples of the metal soaps include metal salts of fatty acids formed from linear fatty acids such as stearic acid, lauric acid, ricinoleic acid and octyl acid or cyclic fatty acids such as naphthenic acid and metals such as lithium, magnesium, calcium, barium, copper and zinc. Examples thereof include zinc octylate. These curing accelerators may be used singly or in combination of two or more kinds thereof.

As described above, the resin composition according to the present embodiment may contain a filler such as an inorganic filler. Examples of the filler include those to be added to enhance the heat resistance and flame retardancy of a cured product of the resin composition, but the filler is not particularly limited. In addition, the heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler subjected to a surface treatment with the silane coupling agent may be used. When a filler is contained, the content thereof (filler content) is preferably 20% to 270% by mass, more preferably 30% to 250% by mass with respect to the resin composition.

(Production Method)

The method for producing the resin composition is not particularly limited, and examples thereof include a method in which the polybutadiene compound, the polyphenylene ether compound, and the curing agent are mixed together so as to have predetermined contents. Specific examples thereof include the method to be described later in the case of obtaining a varnish-like composition containing an organic solvent.

By using the resin composition according to the present embodiment, a prepreg, a metal-clad laminate, a wiring board, a metal foil with resin, and a film with resin can be obtained as follows.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is in a state in which the resin composition has been semi-cured (B-staged). For example, when the resin composition is heated, the viscosity gradually decreases at first, and then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. The resin composition or the semi-cured product of the resin composition may be a dried or heat-dried product of the resin composition.

When manufacturing a prepreg, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent to be used here is not particularly limited as long as it dissolves the polybutadiene compound, the polyphenylene ether compound, the curing agent, and the like and does not inhibit the curing reaction. Specific examples thereof include toluene and methyl ethyl ketone (MEK).

The method for manufacturing the prepreg is not particularly limited as long as the prepreg can be manufactured. Specifically, when manufacturing a prepreg, the resin composition which has been described above and is used in the present embodiment is often prepared in a varnish form and used as a resin varnish as described above.

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less.

The method for manufacturing the prepreg is not particularly limited as long as the prepreg can be manufactured. Specifically, when manufacturing a prepreg, the resin composition according to the present embodiment described above is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition which provides a cured product exhibiting low dielectric properties and a high adhesive property to a metal foil. For this reason, the prepreg including this resin composition or a semi-cured product of this resin composition is a prepreg which provides a cured product exhibiting low dielectric properties and a high adhesive property to a metal foil. Moreover, a wiring board including an insulating layer exhibiting low dielectric properties and a high adhesive property to wiring can be suitably manufactured using this prepreg.

[Metal-Clad Laminate]

Figure 2:
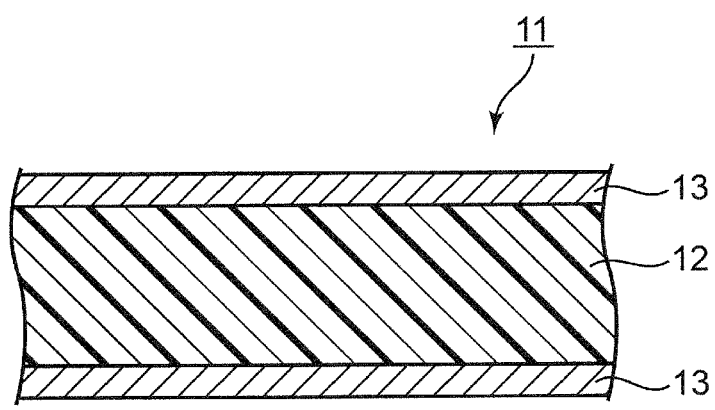
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 includes an insulating layer 12 containing a cured product of the prepreg 1 illustrated in FIG. 1 and a metal foil 13 to be laminated together with the insulating layer 12. In other words, the metal-clad laminate 11 includes the insulating layer 12 containing a cured product of a resin composition and the metal foil 13 provided on the insulating layer 12. In addition, the insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 μm. Moreover, examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. Moreover, the heating and pressing conditions can be appropriately set depending on the thickness of the metal-clad laminate 11 to be manufactured, the kind of the composition of the prepreg 1, and the like. For example, it is possible to set the temperature to 170° C. to 230° C., the pressure to 2 to 5 MPa, and the time to 60 to 150 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The thickness of the metal foil is preferably 0.2 to 35 μm, more preferably 1 to 18 μm. Although the metal foil is such thin, the adhesive property between the insulating layer containing the cured product of the resin composition and the metal foil in the obtained metal-clad laminate is sufficiently high when the metal-clad laminate is manufactured using the resin composition according to the present embodiment.

The resin composition according to the present embodiment is a resin composition which provides a cured product exhibiting low dielectric properties and a high adhesive property to a metal foil. For this reason, the metal-clad laminate including an insulating layer containing the cured product of this resin composition is a metal-clad laminate including an insulating layer exhibiting low dielectric properties and a high adhesive property to a metal foil. Moreover, a wiring board including an insulating layer exhibiting low dielectric properties and a high adhesive property to wiring such as wiring derived from a metal foil can be suitably manufactured using this metal-clad laminate.

[Wiring Board]

Figure 3:
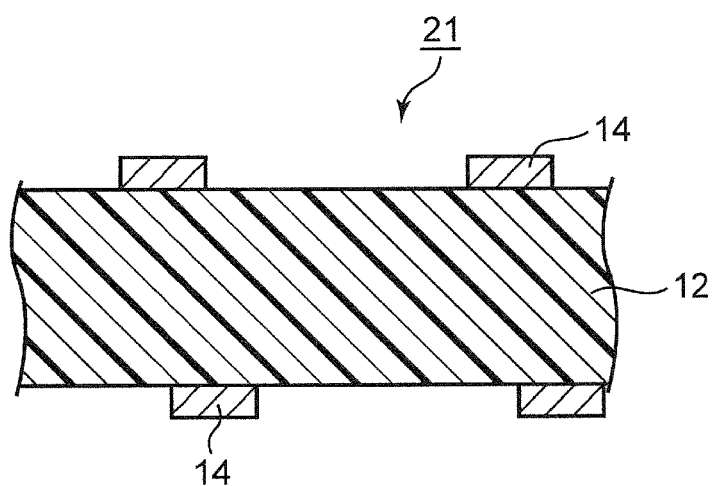
FIG. 3 is a schematic sectional view illustrating an example of a wiring board according to an embodiment of the present invention.

FIG. 3 is a schematic sectional view illustrating an example of a wiring board 21 according to an embodiment of the present invention.

The wiring board 21 according to the present embodiment is formed of an insulating layer 12 obtained by curing the prepreg 1 illustrated in FIG. 1 and wiring 14 which is laminated together with the insulating layer 12 and is formed by partially removing the metal foil 13 as illustrated in FIG. 3. In other words, the wiring board 21 includes the insulating layer 12 containing a cured product of a resin composition and the wiring 14 provided on the insulating layer 12. In addition, the insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. In addition, examples of the method for forming a circuit include circuit formation by a semi-additive process (SAP) or a modified semi-additive process (MSAP) in addition to the method described above. The wiring board 21 includes the insulating layer 12 having a high glass transition temperature, excellent flame retardancy, low water absorbing property, and sufficiently suppressed increases in dielectric constant and dielectric loss tangent due to water absorption even after water absorption.

Such a wiring board is a wiring board including an insulating layer exhibiting low dielectric properties and a high adhesive property to wiring.

[Metal Foil with Resin]

Figure 4:
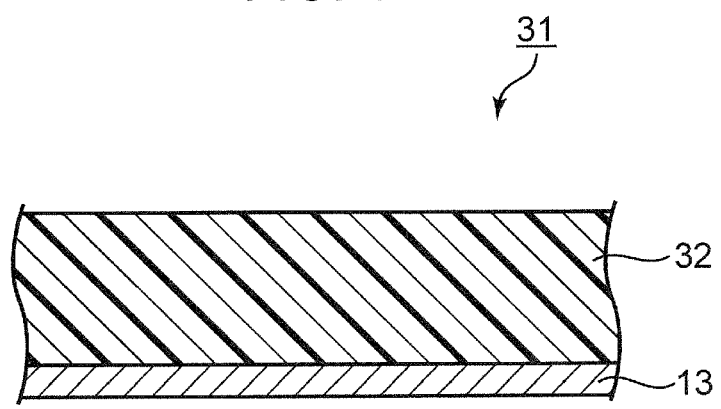
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. Moreover, the metal foil with resin 31 may include other layers between the resin layer 32 and the metal foil 13.

In addition, the resin layer 32 may contain a semi-cured product of the resin composition as described above or may contain the uncured resin composition. In other words, the metal foil with resin 31 may be a metal foil with resin including a resin layer containing a semi-cured product of the resin composition (the B-stage resin composition) and a metal foil or a metal foil with resin including a resin layer containing the resin composition before being cured (the A-stage resin composition) and a metal foil. Moreover, the resin layer only needs to contain the resin composition or a semi-cured product of the resin composition and may or may not contain a fibrous base material. The resin composition or the semi-cured product of the resin composition may be a dried or heat-dried product of the resin composition. As the fibrous base material, those similar to the fibrous base materials of the prepreg can be used.

Moreover, as the metal foil, metal foils to be used in metal-clad laminates can be used without being limited. Examples of the metal foil include a copper foil and an aluminum foil.

The metal foil with resin 31 and a film with resin 41 may include a cover film and the like if necessary. By including the cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 40° C. or more and 180° C. or less and 0.1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition which provides a cured product exhibiting low dielectric properties and a high adhesive property to a metal foil. For this reason, the metal foil with resin including a resin layer containing this resin composition or a semi-cured product of this resin composition is a metal foil with resin including a resin layer, which provides a cured product exhibiting low dielectric properties and a high adhesive property to a metal foil. Moreover, this metal foil with resin can be used when a wiring board including an insulating layer exhibiting low dielectric properties and a high adhesive property to wiring is suitably manufactured. For example, by laminating the metal foil with resin on a wiring board, a multilayer wiring board can be manufactured. As the wiring board obtained by using such a metal foil with resin, a wiring board including an insulating layer exhibiting low dielectric properties and a high adhesive property to wiring is obtained.

[Film with Resin]

Figure 5:
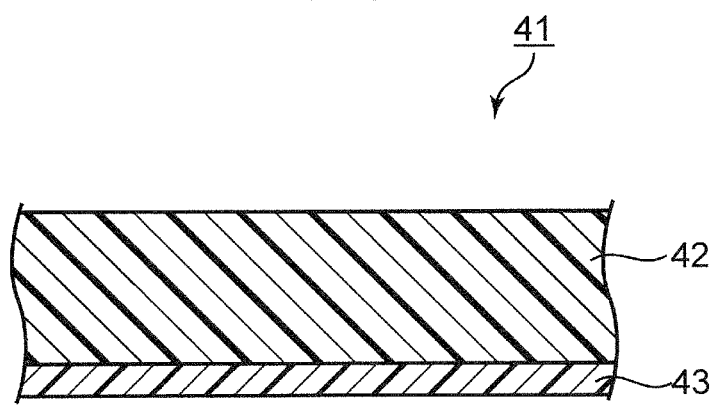
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. Moreover, the film with resin 41 may include other layers between the resin layer 42 and the support film 43.

In addition, the resin layer 42 may contain a semi-cured product of the resin composition as described above or may contain the uncured resin composition. In other words, the film with resin 41 may be a film with resin including a resin layer containing a semi-cured product of the resin composition (the B-stage resin composition) and a support film or a film with resin including a resin layer containing the resin composition before being cured (the A-stage resin composition) and a support film. Moreover, the resin layer only needs to contain the resin composition or a semi-cured product of the resin composition and may or may not contain a fibrous base material. The resin composition or the semi-cured product of the resin composition may be a dried or heat-dried product of the resin composition. As the fibrous base material, those similar to the fibrous base materials of the prepreg can be used.

Moreover, as the support film 43, support film to be used in film with resin can be used without being limited. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 40° C. or more and 180° C. or less and 0.1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition which provides a cured product exhibiting low dielectric properties and a high adhesive property to a metal foil. For this reason, the film with resin including a resin layer containing this resin composition or a semi-cured product of this resin composition is a film with resin including a resin layer, which provides a cured product exhibiting low dielectric properties and a high adhesive property to a metal foil. Moreover, this film with resin can be used when a wiring board including an insulating layer exhibiting low dielectric properties and a high adhesive property to wiring is suitably manufactured. A multilayer wiring board can be manufactured, for example, by laminating the film with resin on a wiring board and then peeling off the support film from the film with resin or by peeling off the support film from the film with resin and then laminating the film with resin on a wiring board. As the wiring board obtained by using such a film with resin, a wiring board including an insulating layer exhibiting low dielectric properties and a high adhesive property to wiring is obtained.

The present specification discloses various aspects of a technique as described above, but the main technique is summarized below.

An aspect of the present invention is a resin composition containing a polybutadiene compound having an epoxy group in a molecule, a polyphenylene ether compound having at least one of a group represented by the following Formula (1) and a group represented by the following Formula (2) in a molecule, a styrene-based block copolymer, and a curing agent.

[Chem. 15]

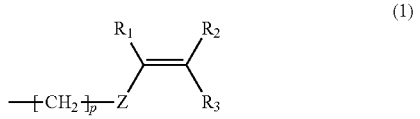

(1)

In Formula (1), p represents 0 to 10, Z represents an arylene group, and $R_1$ to $R_3$ each independently represent a hydrogen atom or an alkyl group.

[Chem. 16]

(2)

In Formula (2), $R_4$ represents a hydrogen atom or an alkyl group.

According to such a configuration, it is possible to provide a resin composition, which provides a cured product exhibiting low dielectric properties and a high adhesive property to a metal foil.

This is considered to be due to the following.

First, it is considered that a cured product which maintains the excellent low dielectric properties of polyphenylene ether is obtained from the resin composition by curing the polyphenylene ether compound together with the curing agent even though the polybutadiene compound and the styrene-based block copolymer are contained. The resin composition contains a polybutadiene compound having an epoxy group in the molecule together with the styrene-based block copolymer, and thus provides a cured product having a high adhesive property to a metal foil. From these facts, it is considered that the resin composition provides a cured product exhibiting low dielectric properties and a high adhesive property to a metal foil.

In the resin composition, it is preferable that the content of the polybutadiene compound is 5 to 40 parts by mass with respect to 100 parts by mass of the sum of the polybutadiene compound, the polyphenylene ether compound, and the curing agent.

According to such a configuration, a resin composition is obtained, which becomes a cured product exhibiting a higher adhesive property to a metal foil while maintaining excellent low dielectric properties when being cured.

In the resin composition, it is preferable that the content of the polybutadiene compound is 3 to 20 parts by mass with respect to 100 parts by mass of the sum of the polybutadiene compound, the polyphenylene ether compound, the styrene-based block copolymer, and the curing agent.

According to such a configuration, a resin composition is obtained, which becomes a cured product exhibiting a higher adhesive property to a metal foil while maintaining excellent low dielectric properties when being cured.

In the resin composition, it is preferable that the curing agent contains an allyl compound.

According to such a configuration, there is provided a resin composition, which suitably provides a cured product exhibiting low dielectric properties and a high adhesive property to a metal foil. It is considered that this is because the allyl compound can suitably cure the polyphenylene ether compound together with the polybutadiene compound and the styrene-based block copolymer.

In the resin composition, it is preferable that the allyl compound includes an allyl isocyanurate compound having two or more allyl groups in the molecule.

According to such a configuration, there is provided a resin composition, which suitably provides a cured product exhibiting low dielectric properties and a high adhesive property to a metal foil. It is considered that this is because the allyl isocyanurate compound can suitably cure the polyphenylene ether compound together with the polybutadiene compound and the styrene-based block copolymer.

In the resin composition, it is preferable that the concentration of oxirane oxygen in the polybutadiene compound is 1% to 10% by mass.

According to such a configuration, a resin composition is obtained, which becomes a cured product exhibiting a higher adhesive property to a metal foil while maintaining excellent low dielectric properties when being cured. It is considered that this is because the effect of improving the adhesive property of the cured product to the metal foil can be more suitably exerted by containing the polybutadiene compound.

In the resin composition, it is preferable that the styrene-based block copolymer includes at least one selected from the group consisting of a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, a styrene isobutylene styrene copolymer, and any hydrogenated product of these copolymers.

According to such a configuration, a resin composition is obtained, which becomes a cured product exhibiting a higher adhesive property to a metal foil while maintaining excellent low dielectric properties when being cured. It is considered that this is because it is possible to suppress a decrease in the adhesive property of the cured product to the metal foil by containing the styrene-based block copolymer.

In the resin composition, it is preferable that the polyphenylene ether compound includes a polyphenylene ether compound having the group represented by Formula (2) in the molecule.

According to such a configuration, it is possible to provide a resin composition, which provides a cured product exhibiting low dielectric properties and a high adhesive property to a metal foil.

In addition, another aspect of the present invention is a prepreg comprising the resin composition or a semi-cured product of the resin composition, and a fibrous base material.

According to such a configuration, it is possible to provide a prepreg, which provides a cured product exhibiting low dielectric properties and a high adhesive property to a metal foil.

In addition, another aspect of the present invention is a film with resin comprising a resin layer containing the resin composition or a semi-cured product of the resin composition, and a support film.

According to such a configuration, it is possible to provide a film with resin including a resin layer, which provides a cured product exhibiting low dielectric properties and a high adhesive property to a metal foil.

In addition, another aspect of the present invention is a metal foil with resin comprising a resin layer containing the resin composition or a semi-cured product of the resin composition, and a metal foil.

According to such a configuration, it is possible to provide a metal foil with resin including a resin layer, which provides a cured product exhibiting low dielectric properties and a high adhesive property to a metal foil.

In addition, another aspect of the present invention is a metal-clad laminate comprising an insulating layer containing a cured product of the resin composition or a cured product of the prepreg, and a metal foil.

According to such a configuration, it is possible to provide a metal-clad laminate including an insulating layer containing a cured product exhibiting low dielectric properties and a high adhesive property to a metal foil.

In addition, another aspect of the present invention is a wiring board comprising an insulating layer containing a cured product of the resin composition or a cured product of the prepreg, and wiring.

According to such a configuration, it is possible to provide a wiring board including an insulating layer containing a cured product exhibiting low dielectric properties and a high adhesive property to a metal foil.

According to the present invention, it is possible to provide a resin composition, which provides a cured product exhibiting low dielectric properties and a high adhesive property to a metal foil. In addition, according to the present invention, a prepreg, a film with resin, a metal foil with resin, a metal-clad laminate, and a wiring board which are obtained using the resin composition are provided.

Hereinafter, the present invention will be described more specifically with reference to examples, but the scope of the present invention is not limited thereto.

EXAMPLES

Examples 1 to 7 and Comparative Examples 1 to 3

The respective components to be used when a resin composition is prepared in the present Examples will be described.

(Epoxy Group-Containing Polybutadiene)

Epoxy group-containing polybutadiene 1: Polybutadiene compound having an epoxy group in the molecule (JP-100 manufactured by NIPPON SODA CO., LTD., oxirane concentration: 7.7% by mass) Epoxy group-containing polybutadiene 2: Polybutadiene compound having an epoxy group in the molecule (PB3600 manufactured by Daicel Corporation, oxirane concentration: 8.2% by mass) Epoxy group-containing polybutadiene 3: Polybutadiene compound having an epoxy group in the molecule (Ricon 657 manufactured by Cray Valley, oxirane concentration: 6.7% by mass)

(Polyphenylene Ether Compound: PPE)

Modified PPE1: Polyphenylene ether compound having a methacryloyl group at the terminal (modified polyphenylene ether obtained by modifying the terminal hydroxyl groups of polyphenylene ether with a methacryloyl group, a modified polyphenylene ether compound represented by Formula (12), where Y is a dimethylmethylene group (a group represented by Formula (9), where $R_{33}$ and $R_{34}$ are a methyl group), SA9000 manufactured by SABIC Innovative Plastics, weight average molecular weight Mw: 2000, number of terminal functional groups: 2)

Modified PPE2: Polyphenylene ether compound having a vinylbenzyl group (ethenylbenzyl group) at the terminal (modified polyphenylene ether obtained by reacting polyphenylene ether with chloromethylstyrene).

Specifically, this is a modified polyphenylene ether obtained by conducting reaction as follows.

First, 200 g of polyphenylene ether (SA90 manufactured by SABIC Innovative Plastics, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. The mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether having a vinylbenzyl group (ethenylbenzyl group) as a substituent at the molecular terminal in the molecule. Specifically, it was confirmed that the solid obtained was ethenylbenzylated polyphenylene ether. The obtained modified polyphenylene ether compound was a modified polyphenylene ether compound represented by Formula (11), where Y was a dimethylmethylene group (represented by Formula (9), where $R_{33}$ and $R_{34}$ were a methyl group), Z was a phenylene group, $R_1$ to $R_3$ were a hydrogen atom, and p was 1.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether was calculated from the measurement result using the following equation.

Residual OH amount (μmol/g)=[(25×Abs)/(ε×OPL×X)]×$10^6$

Here, ε indicates the extinction coefficient and is 4700 L/mol·cm. In addition, OPL indicates the cell path length and is 1 cm.

Moreover, since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

The intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. The weight average molecular weight (Mw) was calculated from the obtained molecular weight distribution. As a result, Mw was 1,900.

(Styrene-Based Block Copolymer)

TR2827: Styrene butadiene styrene copolymer (TR2827 manufactured by JSR Corporation)

Septon 8007: Hydrogenated styrene (ethylene/butylene) styrene copolymer (Septon 8007 manufactured by Kuraray Co., Ltd.)

Septon V9827: Hydrogenated methylstyrene (ethylene/butylene) methylstyrene copolymer (Septon V9827 manufactured by Kuraray Co., Ltd.)

(Curing Agent: Allyl Compound)

TAIC: Triallyl isocyanurate (TAIC manufactured by Nihon Kasei CO., LTD.)

TMPT: Trimethylolpropane trimethacrylate (TMPT manufactured by SHIN-NAKAMURA CHEMICAL CO., LTD.)

(Others)

Polybutadiene: Polybutadiene (B-1000 manufactured by NIPPON SODA CO., LTD., oxirane concentration: 0% by mass)

Epoxy resin: Bisphenol A type epoxy resin (830S manufactured by DIC Corporation)

Initiator: α,α'-Di(t-butylperoxy)diisopropylbenzene (Perbutyl P (PBP) manufactured by NOF CORPORATION)

Curing accelerator: 2-Ethyl-4-methylimidazole (2E4MZ manufactured by Shikoku Chemicals Corporation)

Filler: Silica treated with vinylsilane (SV-C2 manufactured by Admatechs Company Limited, average particle size: 1.5 μm)

[Preparation Method]

First, the respective components other than the filler were added to and mixed in toluene at the compositions (parts by mass) presented in Table 1 so that the solid concentration was 50% by mass. The mixture was stirred for 60 minutes. Thereafter, the filler was added to and dispersed in the obtained liquid using a bead mill. By doing so, a varnish-like resin composition (varnish) was obtained.

Next, an evaluation substrate (cured product of metal foil with resin) was obtained as follows.

The obtained varnish was applied to a metal foil (copper foil, 3EC-VLP manufactured by MITSUI MINING & SMELTING CO., LTD., thickness: 12 μm) so as to have a thickness of 50 μm, and heated at 120° C. for 3 minutes to obtain a metal foil with resin. Two sheets of the obtained metal foil with resin were then stacked so that the resin layers were in contact with each other. The resin layer of the metal foil with resin was cured by heating and pressurizing this as a body to be pressurized for 2 hours under the conditions of 200° C. and a pressure of 4 MPa in a vacuum. This was used as an evaluation substrate (cured product of metal foil with resin). The thickness of the resin layer (thickness other than the metal foil) in the evaluation substrate was 100 μm.

The evaluation substrate (cured product of metal foil with resin) prepared as described above was evaluated by the methods described below.

[Dielectric Properties (Relative Dielectric Constant and Dielectric Loss Tangent)]

The relative dielectric constant and dielectric loss tangent of the laminate obtained by removing the copper foil from the evaluation substrate (cured product of metal foil with resin) at 10 GHz were measured by a cavity perturbation method. Specifically, the relative dielectric constant and dielectric loss tangent of the laminate obtained by removing the copper foil from the evaluation substrate at 10 GHz were measured using a network analyzer (N5230A manufactured by Agilent Technologies, Inc.).

[Copper Foil Peel Strength]

The copper foil was peeled off from the evaluation substrate (cured product of metal foil with resin), and the peel strength (copper foil peel strength) at that time was measured in conformity with JIS C6481. Specifically, the copper foil was peeled off from the evaluation substrate at a speed of 50 mm/min using a tensile tester, and the peel strength (N/mm) at that time was measured.

[Glass Transition Temperature (Tg)]

The Tg of the laminate obtained by removing the copper foil from the evaluation substrate (cured product of metal foil with resin) was measured using a viscoelastic spectrometer "DMS6100" manufactured by Seiko Instruments Inc. At this time, dynamic mechanical analysis (DMA) was performed at a frequency of 10 Hz using a tension module, and the temperature at which tan δ was the maximum when the temperature was raised from room temperature to 320° C. under the condition of a rate of temperature rise of 5° C./min was defined as Tg.

The results of the respective evaluations are presented in Table 1.

property to a metal foil can be achieved at the same time by containing a polybutadiene compound having an epoxy group in the molecule and a styrene-based block copolymer in a resin composition containing the polyphenylene ether compound and the curing agent. Furthermore, in Examples

TABLE 1

| | | | Examples | | | | |
|---|---|---|---|---|---|---|---|
| | | | 1 | 2 | 3 | 4 | 5 |
| Composition (parts by mass) | Epoxy group-containing polybutadiene 1 | | 17.5 | 10 | 5 | 10 | — |
| | Epoxy group-containing polybutadiene 2 | | — | — | — | — | 10 |
| | Epoxy group-containing polybutadiene 3 | | — | — | — | — | — |
| | PPE | Modified PPE1 | 35 | 40 | 40 | — | 40 |
| | | Modified PPE2 | — | — | — | 40 | — |
| | Styrene-based block copolymer | TR2827 | 30 | — | — | — | — |
| | | Septon8007 | — | — | 40 | — | — |
| | | SeptonV9827 | — | 40 | — | 40 | 40 |
| | Curing agent | TAIC | 17.5 | 10 | 15 | 10 | 10 |
| | | TMPT | — | — | — | — | — |
| | Polybutadiene | | — | — | — | — | — |
| | Epoxy resin | | — | — | — | — | — |
| | Initiator | Perbutyl P | 1 | 1 | 1 | 1 | 1 |
| | Curing accelerator | 2E4MZ | 0.1 | 0.1 | 0.1 | 0.1 | 0.1 |
| | Filler | | 150 | 150 | 150 | 150 | 150 |
| Evaluation | Relative dielectric constant | | 2.70 | 2.60 | 2.70 | 2.60 | 2.65 |
| | Dielectric loss tangent | | 0.0034 | 0.0024 | 0.0022 | 0.0024 | 0.0026 |
| | Copper foil peel strength (N/m) | | 0.45 | 0.60 | 0.45 | 0.50 | 0.65 |
| | Glass transition temperature Tg (° C.) | | 240 | 260 | 235 | 240 | 255 |

| | | | Examples | | Comparative Example | | |
|---|---|---|---|---|---|---|---|
| | | | 6 | 7 | 1 | 2 | 3 |
| Composition (parts by mass) | Epoxy group-containing polybutadiene 1 | | — | 10 | — | — | — |
| | Epoxy group-containing polybutadiene 2 | | — | — | — | — | — |
| | Epoxy group-containing polybutadiene 3 | | 10 | — | — | — | — |
| | PPE | Modified PPE1 | 40 | 40 | 35 | 35 | 40 |
| | | Modified PPE2 | — | — | — | — | — |
| | Styrene-based block copolymer | TR2827 | — | — | 30 | 30 | — |
| | | Septon8007 | — | — | — | — | — |
| | | SeptonV9827 | 40 | 40 | — | — | 40 |
| | Curing agent | TAIC | 10 | — | 35 | 17.5 | 10 |
| | | TMPT | — | 10 | — | — | — |
| | Polybutadiene | | — | — | — | 17.5 | — |
| | Epoxy resin | | — | — | — | — | 10 |
| | Initiator | Perbutyl P | 1 | 1 | 1 | 1 | 1 |
| | Curing accelerator | 2E4MZ | 0.1 | 0.1 | — | — | 0.1 |
| | Filler | | 150 | 150 | 150 | 150 | 150 |
| Evaluation | Relative dielectric constant | | 2.55 | 2.55 | 2.75 | 2.75 | 2.75 |
| | Dielectric loss tangent | | 0.0022 | 0.0026 | 0.0015 | 0.0016 | 0.0035 |
| | Copper foil peel strength (N/m) | | 0.55 | 0.55 | 0.40 | 0.35 | 0.60 |
| | Glass transition temperature Tg (° C.) | | 260 | 230 | 260 | 240 | 230 |

As can be seen from Table 1, in a resin composition containing the polyphenylene ether compound and the curing agent, in a case where a polybutadiene compound having an epoxy group in the molecule and a styrene-based block copolymer were contained (Examples 1 to 7), the dielectric properties were lower and the copper foil peel strength was higher compared with those in a case where the polybutadiene compound having an epoxy group in the molecule was not contained (Comparative Examples 1 to 3). For example, even in a case where polybutadiene was contained instead of the polybutadiene compound having an epoxy group in the molecule (Comparative Example 2), it was not possible to enhance the copper foil peel strength. In a case where an epoxy resin was contained instead of the polybutadiene compound having an epoxy group in the molecule (Comparative Example 3), it was possible to enhance the copper foil peel strength but it was not possible to sufficiently achieve low dielectric properties. Consequently, it has been found that both low dielectric properties and a high adhesive 1 to 7, it has been found that a high adhesive property to a metal foil (copper foil) can be exerted in the case of using a relatively thin copper foil having a thickness of 12 μm.

In any of a case of using epoxy group-containing polybutadiene 1 having a concentration of oxirane oxygen of 7.7% by mass (Examples 2 and the like), a case of using epoxy group-containing polybutadiene 2 having a concentration of oxirane oxygen of 8.2% by mass (Example 5), and a case of using epoxy group-containing polybutadiene 3 having a concentration of oxirane oxygen of 6.7% by mass (Example 6) as the polybutadiene compound having an epoxy group in the molecule, the dielectric properties were lower and the copper foil peel strength was higher compared with those in Comparative Examples 1 to 3. Also from this fact, it can be seen that the concentration of oxirane oxygen in the polybutadiene compound having an epoxy group in the molecule is preferably 1% to 10% by mass.

In a case where TAIC was used as a curing agent (Example 2), the glass transition temperature was higher compared with that in Example 7, which was similar to Example 2 except that TMPT was used. Also from this fact, it can be seen that the curing agent preferably contains an allyl compound such as an allyl isocyanurate compound having two or more allyl groups in the molecule.

This application is based on Japanese Patent Application No. 2019-132004 filed on Jul. 17, 2019, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a resin composition, which provides a cured product exhibiting low dielectric properties and a high adhesive property to a metal foil. In addition, according to the present invention, a prepreg, a film with resin, a metal foil with resin, a metal-clad laminate, and a wiring board which are obtained using the resin composition are provided.

The invention claimed is:

1. A resin composition comprising:
a polybutadiene compound having an epoxy group in a molecule;
a polyphenylene ether compound having at least one of a group represented by the following Formula (1) and a group represented by the following Formula (2) in a molecule;
a styrene-based block copolymer; and
a curing agent:

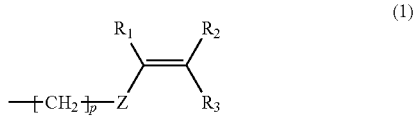

(wherein in Formula (1), p represents 0 to 10, Z represents an arylene group, and $R_1$ to $R_3$ each independently represent a hydrogen atom or an alkyl group) group,

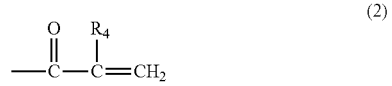

(wherein in Formula (2), $R_4$ represents a hydrogen atom or an alkyl) group.

2. The resin composition according to claim 1, wherein a content of the polybutadiene compound is 5 to 40 parts by mass with respect to 100 parts by mass of a sum of the polybutadiene compound, the polyphenylene ether compound, and the curing agent.

3. The resin composition according to claim 1, wherein a content of the polybutadiene compound is 3 to 20 parts by mass with respect to 100 parts by mass of a sum of the polybutadiene compound, the polyphenylene ether compound, the styrene-based block copolymer, and the curing agent.

4. The resin composition according to claim 1, wherein the curing agent contains an allyl compound.

5. The resin composition according to claim 4, wherein the allyl compound includes an allyl isocyanurate compound having two or more allyl groups in a molecule.

6. The resin composition according to claim 1, wherein a concentration of oxirane oxygen in the polybutadiene compound is 1% to 10% by mass.

7. The resin composition according to claim 1, wherein the styrene-based block copolymer includes at least one selected from the group consisting of a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, a styrene isobutylene styrene copolymer, and any hydrogenated product of these copolymers.

8. The resin composition according to claim 1, wherein the polyphenylene ether compound includes a polyphenylene ether compound having the group represented by Formula (2) in a molecule.

9. A prepreg comprising:
the resin composition according to claim 1 or a semi-cured product of the resin composition; and
a fibrous base material.

10. A metal-clad laminate comprising:
an insulating layer containing a cured product of the prepreg according to claim 9; and
a metal foil.

11. A wiring board comprising:
an insulating layer containing a cured product of the prepreg according to claim 9; and
wiring.

12. A film with resin comprising:
a resin layer containing the resin composition according to claim 1 or a semi-cured product of the resin composition; and
a support film.

13. A metal foil with resin comprising:
a resin layer containing the resin composition according to claim 1 or a semi-cured product of the resin composition; and
a metal foil.

14. A metal-clad laminate comprising:
an insulating layer containing a cured product of the resin composition according to claim 1; and
a metal foil.

15. A wiring board comprising:
an insulating layer containing a cured product of the resin composition according to claim 1; and
wiring.

* * * * *